United States Patent [19]
Chern et al.

[11] Patent Number: 5,530,668
[45] Date of Patent: Jun. 25, 1996

[54] FERROELECTRIC MEMORY SENSING SCHEME USING BIT LINES PRECHARGED TO A LOGIC ONE VOLTAGE

[75] Inventors: Wen-Foo Chern, Wayland, Mass.; Dennis Wilson, Colorado Springs, Colo.

[73] Assignee: Ramtron International Corporation, Colorado Springs, Colo.

[21] Appl. No.: 420,752

[22] Filed: Apr. 12, 1995

[51] Int. Cl.⁶ .............................. G11C 11/22; G11C 7/00
[52] U.S. Cl. ......................... 365/145; 365/149; 365/203
[58] Field of Search ................................. 365/145, 149, 365/203, 205

[56] References Cited

U.S. PATENT DOCUMENTS

| | | | |
|---|---|---|---|
| 4,918,654 | 4/1990 | Eaton, Jr. et al. | 365/145 |
| 5,029,128 | 7/1991 | Toda | 365/145 |
| 5,121,353 | 6/1992 | Notori | 365/145 |

FOREIGN PATENT DOCUMENTS

| 404295690 | 10/1992 | Japan | 365/145 |
|---|---|---|---|

Primary Examiner—David C. Nelms
Assistant Examiner—Son Dinh
Attorney, Agent, or Firm—Peter J. Meza

[57] ABSTRACT

In a ferroelectric memory cell having a plate line, a word line and a bit line coupled to a sense amplifier, a sensing method includes the steps of precharging the bit line to a logic one voltage, setting the word and plate lines to an initial logic zero voltage, stepping the word line from the initial logic zero voltage to the logic one voltage, stepping the plate line from the initial logic zero voltage to the logic one voltage, activating the sense amplifier to resolve voltage developed on the bit line to a full logic voltage while the word and plate lines are at the logic one voltage, and returning the word and plate lines to the initial logic zero voltage.

12 Claims, 9 Drawing Sheets

MODIFIED UP ONLY PULSING
ZERO VOLT INITIAL CONDITION
INSIDE MEMORY CELL
LOGIC ONE DATA STATE

UP ONLY PULSING
ZERO VOLT INITIAL CONDITION
INSIDE MEMORY CELL
LOGIC ONE DATA STATE

FERROELECTRIC MEMORY SENSING SCHEME USING BIT LINES PRECHARGED TO A LOGIC ONE VOLTAGE

BACKGROUND OF THE INVENTION

This invention relates generally to alternative sensing schemes for a ferroelectric memory cell.

The basic configuration 10 of a ferroelectric memory cell 12 is shown in FIG. 1. FIG. 1 includes a one-transistor, one-capacitor memory cell 12 that includes an MOS transistor 14 labeled M1, and a ferroelectric capacitor 16 labeled $C_{Cell}$, which are coupled together at internal cell node 15. Ferroelectric memory cell 12 is a three terminal device in which one end of ferroelectric capacitor 16 is coupled to an active plate line 18, thee gate of transistor 14 is coupled to a word line 20, and the source/drain of transistor 14 is coupled to a bit line 22. Bit line 22 is also coupled to a sense amplifier 26. Sense amplifier 26 receives a reference voltage, VR, at node 28, and an enable signal, SAE, at node 30. The reference voltage, VR, is selected to be about halfway between the voltage developed in response to a logic zero state on bit line 22 and the voltage developed in response to a logic one state on bit line 22. In the prior art sensing schemes, bit line 22 is usually "pre-charged" to ground voltage (zero volts). Sense amplifier 26 resolves the difference in voltages (or charge) found on bit line 22 and the reference voltage node 28 into a full logic voltage on bit line 22, usually five volts or ground voltage. The enable signal at node 30 turns on circuitry in sense amplifier 26 to effect the voltage comparison. Memory cell 12 is typically part of a memory array that is not shown in FIG. 1, arranged in rows and columns.

Memory cell 12 can also be a complementary two-transistor, two capacitor memory cell coupled to a differential bit line (not shown in FIG. 1). In this case, reference voltage VR is not used, and node 28 is connected to a complementary bit line of the memory cell.

A first prior art sensing scheme known as "up down" sensing is illustrated in FIGS. 2A and 2B. FIG. 2A includes a timing diagram of ferroelectric memory cell 12 having a logic one data state. In ferroelectric memories, the data state is determined by the polarization vector of the ferroelectric material used in capacitor 16. The timing diagram of FIG. 2A includes the word line (WL), plate line (PL), and bit line (BL) waveforms. Also included in FIG. 2A is a corresponding hysteresis loop diagram illustrating the polarization states of ferroelectric capacitor 16. As is known in the art, the x-axis of the hysteresis loop represents the applied voltage (V) across the ferroelectric capacitor, whereas the y-axis of the hysteresis loop represents the polarization or charge (Q) associated with the ferroelectric capacitor. The timing diagram of FIG. 2A is labeled at various points in time labeled t1 through t7. These same timing labels are used on the corresponding hysteresis loop diagram to illustrate the behavior of ferroelectric memory cell 12 during the up-down sensing scheme.

At an initial time t1, the word, plate, and bit lines of ferroelectric memory cell 12 are all set to zero volts. At the initial time t1, memory cell 12 is in a logic one state, which is also illustrated on the corresponding hysteresis diagram. By convention, point t1 is located on the negative "Q" axis to represent the logic one state of memory cell 12. At time t2, word line 20 is stepped from the initial logic zero voltage to a logic one voltage, usually five volts. Only changing the voltage on word line 20 does not change the location of the operating point on the hysteresis diagram, which is also labeled t2. At time t3, the plate line is pulsed to a logic one voltage with a positive-going pulse, and a voltage is developed on bit line 22. The operating point on the hysteresis diagram moves from t1, t2, to t3 (representing a positive applied voltage and a corresponding charge). At time t4, the plate line voltage is returned to the logic zero voltage, with a slight loss of voltage on the bit line. The new operating point is also labeled t4 on the hysteresis diagram. Between times t4 and t5, the sense amplifier signal is energized and the voltage on bit line 22 is resolved into a full logic one voltage, when compared to an appropriately selected reference voltage VR. At time t5, therefore, the voltage on word line 20 is high, the voltage on plate line 18 is low, and the voltage on bit line 22 is high. This operating condition corresponds to a negative voltage being applied across ferroelectric capacitor 16, which is also illustrated and labeled t5 on the hysteresis diagram. At time t6, the plate line is again pulsed with a positive-going pulse, which returns to a logic zero level at time t7. The second plate line pulse is only required if new data is written into memory cell 12 between times t4 and t5. At time t7 the original data state is restored, and linear or "DRAM" charge remains in the cell. Over time, however, the DRAM charge leaks away and the voltage at internal node 15 decays, which restores the original operating point at t1 on the hysteresis loop diagram.

FIG. 2B includes a timing diagram of ferroelectric memory cell 12 having a logic zero data state, again in the up-down sensing mode. The timing diagram of FIG. 2B also includes word line (WL), plate line (PL), and bit line (BL) waveforms. The timing diagram of FIG. 2B includes points in time labeled t1 through t7 that are also used on the corresponding hysteresis loop diagram to illustrate the behavior of ferroelectric memory cell 12 during the up-down sensing scheme.

At an initial time t1, the word, plate, and bit lines of ferroelectric memory cell 12 are again all set to zero volts. At the initial time t1, memory cell 12 is in a logic zero state, which is also illustrated on the corresponding hysteresis diagram. By convention, point t1 is located on the positive Q axis to represent the logic zero state of memory cell 12. At time t2, word line 20 is stepped from the initial logic zero voltage to a logic one voltage, usually five volts. Only changing the voltage on word line 20 does not change the location of the operating point on the hysteresis diagram, which is also labeled t2. At time t3, the plate line is pulsed to a logic one voltage with a positive-going pulse, and a voltage is developed on bit line 22. The operating point on the hysteresis diagram moves from t1, t2, to t3 (again, representing a positive applied voltage and a corresponding charge). At time t4, the plate line voltage is returned to the logic zero voltage, with a corresponding loss of voltage on the bit line. The new operating point is also labeled t4 on the hysteresis diagram. Between times t4 and t5, the sense amplifier signal is energized and the voltage on bit line 22 is resolved into a full logic zero voltage, when compared to an appropriately selected reference voltage VR. At time t5, therefore, the voltage on word line 20 is high, the voltage on plate line 18 is low, and the voltage on bit line 22 is also low. This operating condition corresponds to no voltage being applied across ferroelectric capacitor 16 and the original polarization state, which is also illustrated and labeled t5 on the hysteresis diagram. At time t6, the plate line is again pulsed with a positive-going pulse, which returns to a logic zero level at time t7. The second plate line pulse is only required if new data is written into memory cell 12 between times t4 and t5. At time t7 the original operating point is restored.

A second prior art sensing scheme known as "up only" sensing is illustrated in FIGS. 3A and 3B. FIG. 3A includes a timing diagram of ferroelectric memory cell 12 having a logic one data state. The timing diagram of FIG. 3A includes the word line (WL), plate line (PL), and bit line (BL) waveforms. Also included in FIG. 3A is a corresponding hysteresis loop diagram illustrating the polarization states of ferroelectric capacitor 16. The timing diagram of FIG. 3A is labeled at various points in time labeled t1 through t7. These same timing labels are used on the corresponding hysteresis loop diagram to illustrate the behavior of ferroelectric memory cell 12 during the up only sensing scheme.

At an initial time t1, the word, plate, and bit lines of ferroelectric memory cell 12 are all set to zero volts. At the initial time t1, memory cell 12 is in a logic one state, which is also illustrated on the corresponding hysteresis diagram. By convention, point t1 is located on the negative "Q" axis to represent the logic one state of memory cell 12. At time t2, word line 20 is stepped from the initial logic zero voltage to a logic one voltage, usually five volts. Only changing the voltage on word line 20 does not change the location of the operating point on the hysteresis diagram, which is also labeled t2. At time t3, the plate line is pulsed to a logic one voltage with a positive-going pulse, and a voltage is developed on bit line 22. The operating point on the hysteresis diagram moves from t1, t2, to t3 (representing a positive applied voltage and a corresponding charge). Between times t3 and t4, the sense amplifier signal is energized and the voltage on bit line 22 is resolved into a full logic one voltage, when compared to an appropriately selected reference voltage VR. At time t4, therefore, the voltages on word line 20, plate line 18, and bit line 22 are all high. This operating condition corresponds to a no voltage being applied across ferroelectric capacitor 16, but with a flipped polarization state, which is also illustrated and labeled t4 on the hysteresis diagram. At time t5, the plate line is returned to a logic zero level. The corresponding operating condition is illustrated and labeled t5 on the hysteresis diagram. At time t5 the original data state is restored, and linear or DRAM charge remains in the cell. Over time, however, the DRAM charge leaks away and the voltage at internal node 15 decays, which restores the original operating point at t1 on the hysteresis loop diagram.

FIG. 3B includes a timing diagram of ferroelectric memory cell 12 having a logic zero data state, again in the up only sensing mode. The timing diagram of FIG. 3B also includes word line (WL), plate line (PL), and bit line (BL) waveforms. The timing diagram of FIG. 3B includes points in time labeled t1 through t7 that are also used on the corresponding hysteresis loop diagram to illustrate the behavior of ferroelectric memory cell 12 during the up only sensing scheme.

At an initial time t1, the word, plate, and bit lines of ferroelectric memory cell 12 are again all set to zero volts. At the initial time t1, memory cell 12 is in a logic zero state, which is also illustrated on the corresponding hysteresis diagram. By convention, point t1 is located on the positive Q axis to represent the logic zero state of memory cell 12. At time t2, word line 20 is stepped from the initial logic zero voltage to a logic one voltage, usually five volts. Only changing the voltage on word line 20 does not change the location of the operating point on the hysteresis diagram, which is also labeled t2. At time t3, the plate line is pulsed to a logic one voltage with a positive-going pulse, and a small voltage is developed on bit line 22. The operating point on the hysteresis diagram moves from t1, t2, to t3 (again, representing a positive applied voltage and a corresponding charge). Note that operating point 3 is shown to be not completely saturated, due to the small voltage present on bit line 22. Between times t3 and t4, the sense amplifier signal is energized and the voltage on bit line 22 is resolved into a full logic zero voltage, when compared to an appropriately selected reference voltage VR. At time t4, therefore, the voltage on word line 20 and plate line 18 is high, and the voltage on bit line 22 is low. This operating condition corresponds a full logic voltage being applied across ferroelectric capacitor 16, but with the original polarization state, which is also illustrated and labeled t4 on the hysteresis diagram. At time t5, the plate line is returned to a logic zero level and the original operating point is restored.

The "up down" sensing method of FIGS. 2A and 2B is a robust sensing method in that it is relatively insensitive to the properties of the ferroelectric material used; for example a "compensated" ferroelectric material as is evidenced by a shifting and distortion of the corresponding hysteresis loop. The "up down" sensing method of FIGS. 2A and 2B is relatively slow, however, since the plate line pulse must transition both high and low before the sense amplifier can be energized. The "up only" sensing method of FIGS. 3A and 3B is faster than the "up down" sensing method since only one transition of the plate line is involved, but at the price of a less robust sensing method.

What is desired is an alternative robust sensing method for a ferroelectric memory cell that is faster than the prior art "up down" sensing method.

SUMMARY OF THE INVENTION

It is, therefore, a principal object of the present invention to read the contents of a ferroelectric memory cell in the minimum possible time, while preserving the robust ability of the sensing method to read a "compensated" memory cell.

It is an advantage of the invention that the plate line only need be driven high, which minimizes the time necessary to complete the sensing method.

According to the present invention, in a ferroelectric memory cell having a plate line, a word line, and a bit line coupled to a sense amplifier, a first alternative sensing method includes the steps of precharging the bit line to a logic one voltage, setting the word and plate lines to an initial logic zero voltage, stepping the word line from the initial logic zero voltage to the logic one voltage, stepping the plate line from the initial logic zero voltage to the logic one voltage, activating the sense amplifier to resolve voltage developed on the bit line to a full logic voltage while the word and plate lines are at the logic one, voltage, and returning the word and plate lines to the initial logic zero voltage.

A second alternative sensing method for a ferroelectric memory cell includes the steps of precharging the bit line to a logic one voltage, setting the word and plate lines to an initial logic zero voltage, stepping the word line from the initial logic zero voltage to the logic one voltage, activating the sense amplifier to resolve voltage developed on the bit line to a full logic voltage while the word line is at the logic one voltage and the plate line is at the logic zero voltage, pulsing the plate line with a positive-going pulse, and returning the word line to the initial logic zero voltage.

The foregoing and other objects, features and advantages of the invention will become more readily apparent from the following, detailed description of a preferred embodiment of the invention which proceeds with reference to the accompanying drawings.

DETAILED DESCRIPTION

Figure 1:
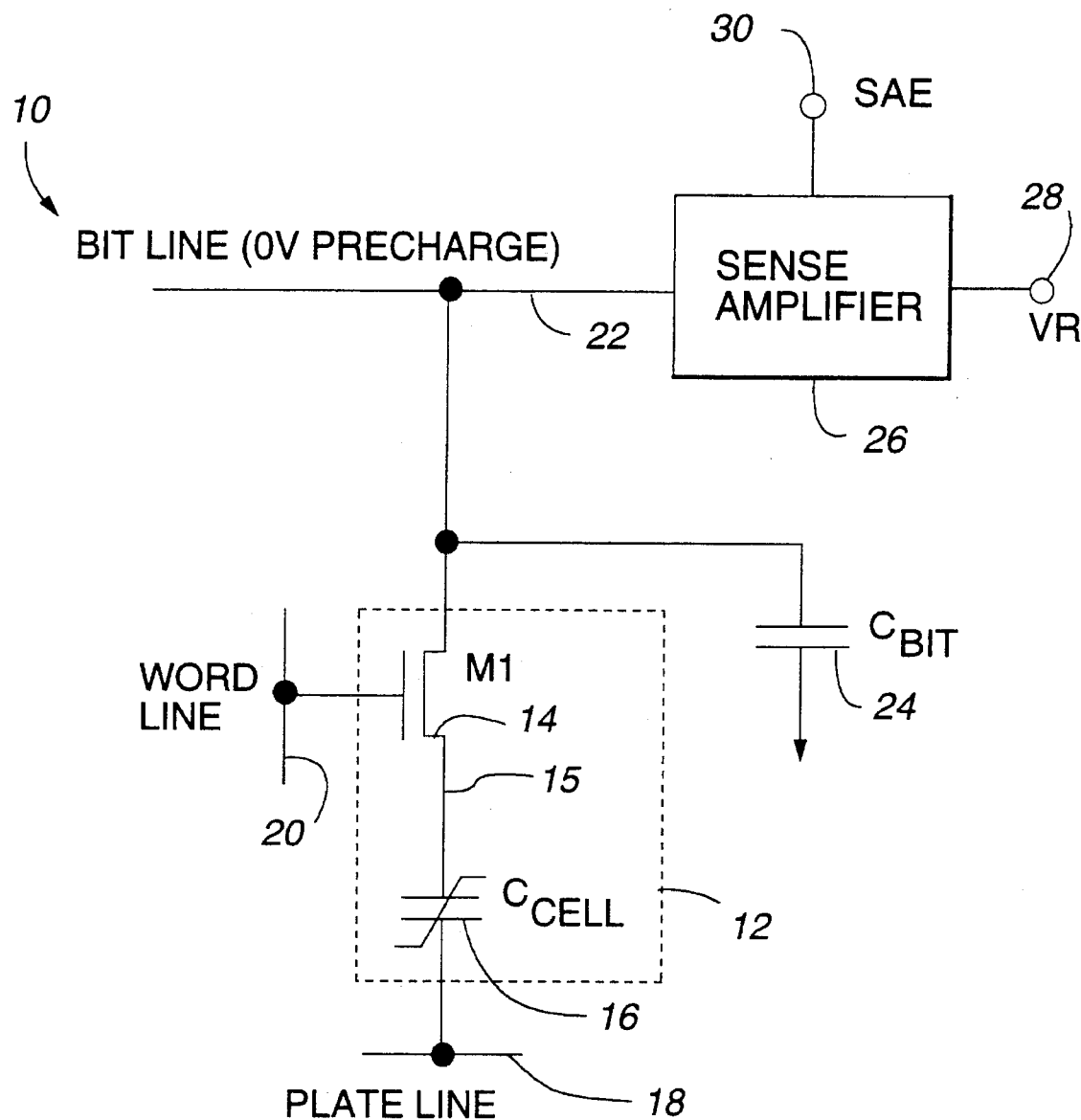
FIG. 1 is a schematic diagram of a prior art ferroelectric memory cell configuration including word, plate, and bit line connections, as well as a sense amplifier coupled to the bit line.
Figure 2A:
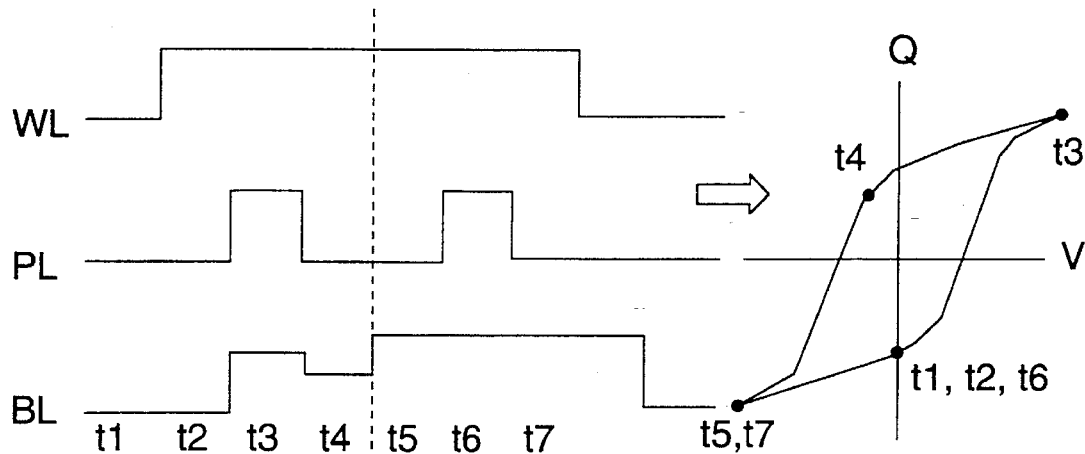
FIGS. 2A–2B are combined timing/hysteresis diagrams that illustrate the operation of the prior art "up down" ferroelectric memory sensing method.
Figure 2B:
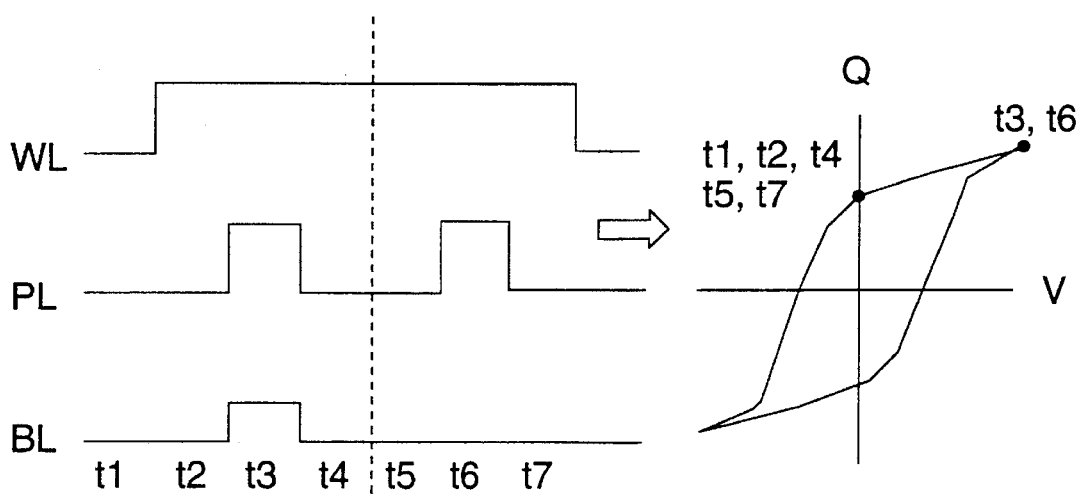
Figure 3A:
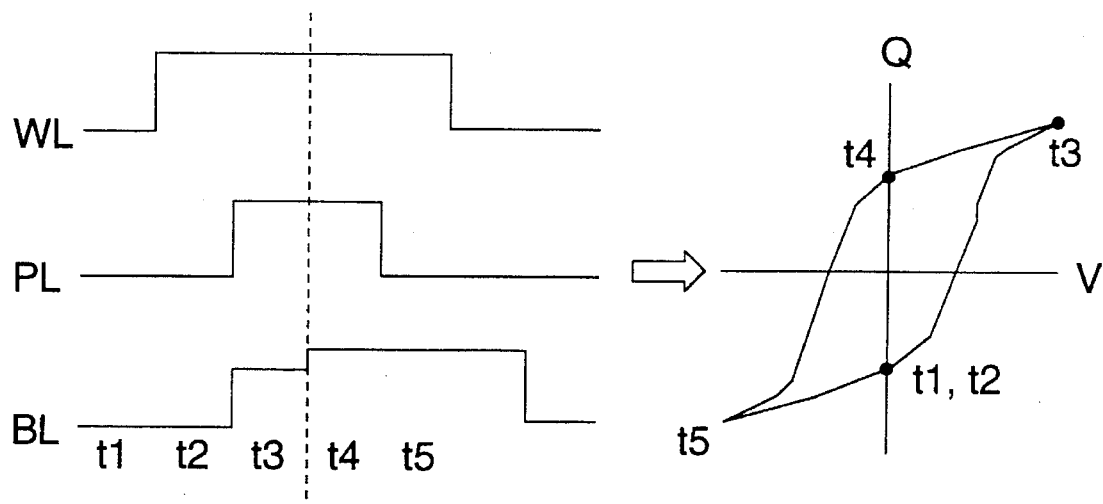
FIGS. 3A–3B are combined timing/hysteresis diagrams that illustrate the operation of the prior art "up only" ferroelectric memory sensing method.
Figure 3B:
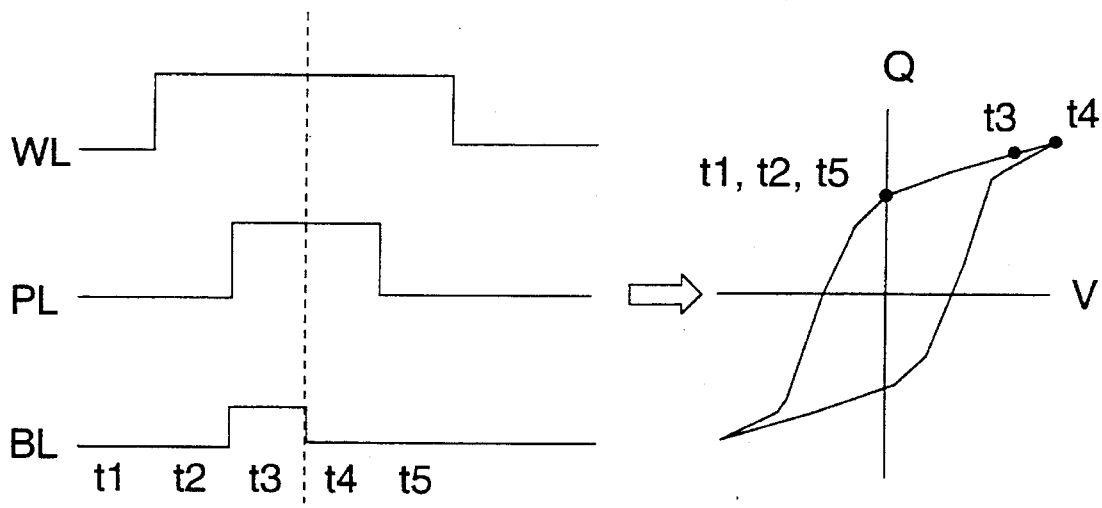
Figure 4:
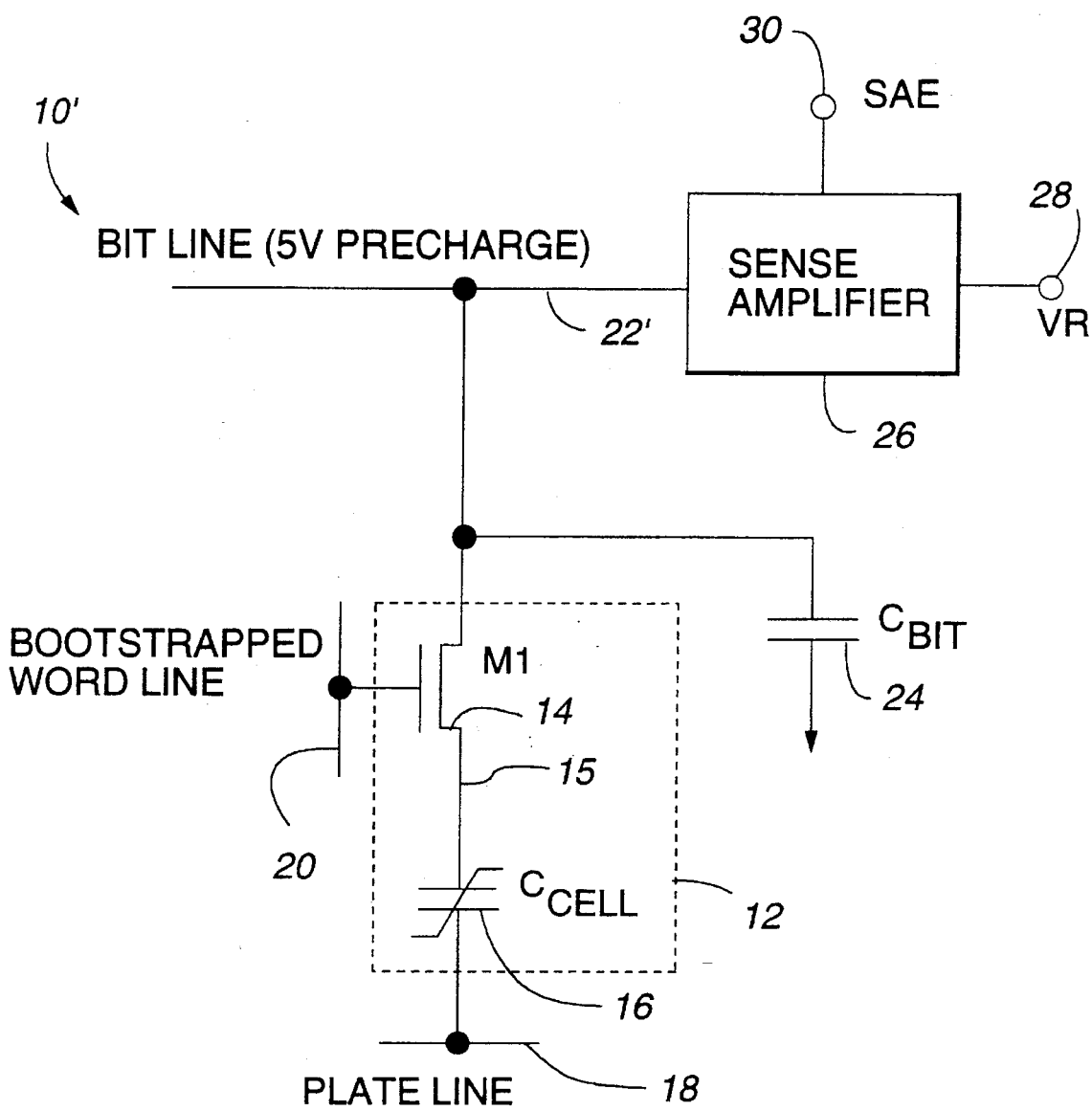
FIG. 4 is a schematic diagram of a ferroelectric memory cell configuration modified according to the present invention including word, plate, and bit line connections, as well as a sense amplifier coupled to the bit line.

The basic configuration 10' of a memory cell 12 modified according to the present invention is shown in FIG. 4. FIG. 4 includes a one-transistor, one-capacitor memory cell 12 that includes an MOS transistor 14 labeled M1, and a ferroelectric capacitor 16 labeled $C_{Cell}$, which are coupled together at internal cell node 15. Ferroelectric memory cell 12 is a three terminal device in which one end of ferroelectric capacitor 16 is coupled to an active plate line 18, the gate of transistor 14 is coupled to a bootstrapped word line 20', and the source/drain of transistor 14 is coupled to a bit line 22'. In the configuration shown in FIG. 4, bit line 22' is precharged to five volts (the typical power supply or logic one voltage, but other voltages can be used accordingly to the application or convention used, such as 3.3 volts) and is also coupled to a sense amplifier 26. Sense amplifier 26 receives a reference voltage, VR, at node 28, and an enable signal, SAE, at node 30. Sense amplifier 26 resolves the difference in voltages (or charge) found on bit line 22' and the reference voltage node 28 into a full logic voltage on bit line 22', usually five volts or ground voltage. The enable signal at node 30 turns on circuitry in sense amplifier 26 to effect the voltage comparison. Memory cell 12 is typically part of a memory array that is not shown in FIG. 4, arranged in rows and columns.

Figure 5A:
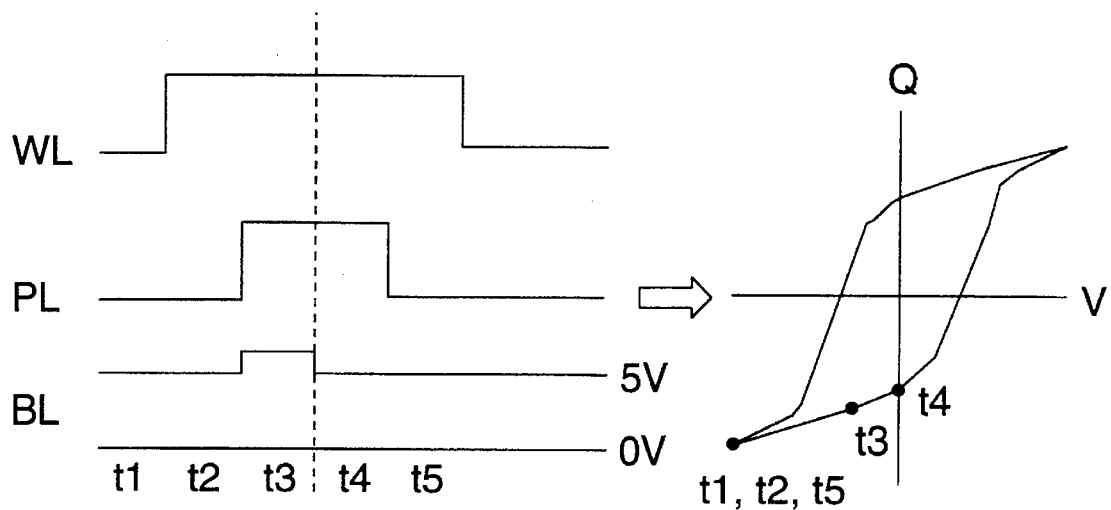
FIGS. 5A–5C are combined timing/hysteresis diagrams that illustrate the operation of a first "modified up only" ferroelectric memory sensing method according to the present invention.
Figure 5B:
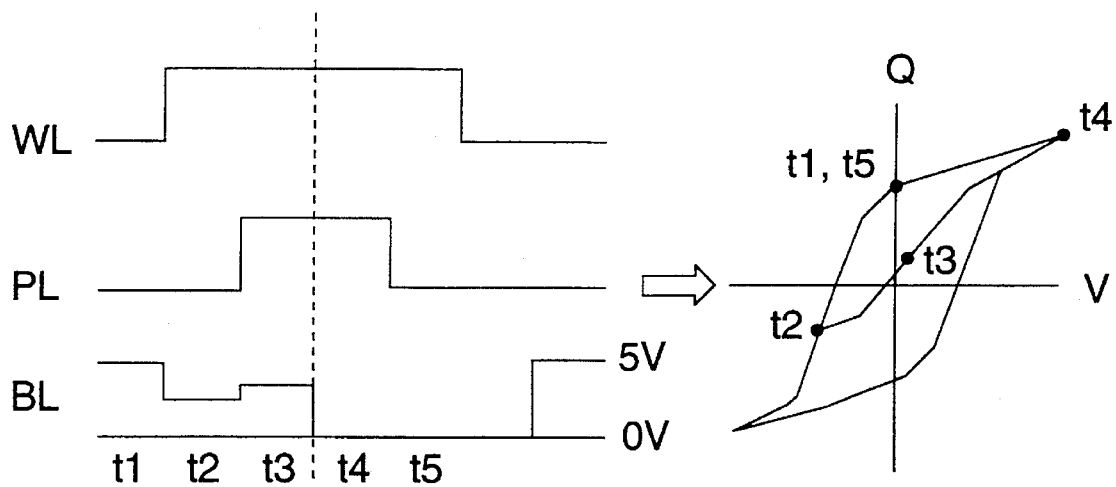
Figure 5C:
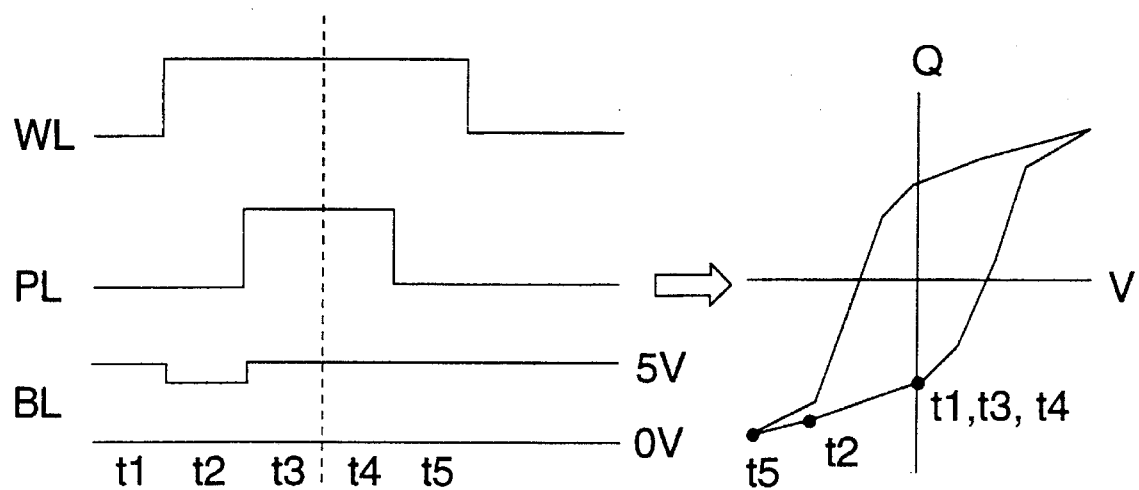

Referring now to FIGS. 5A–C, a first alternative "modified up only"(MUP) sensing scheme is illustrated in three combined timing/hysteresis diagrams. FIG. 5A includes a timing diagram of ferroelectric memory cell 12 having a logic one data state and a five volt initial condition on internal node 15. The timing diagram of FIG. 5A includes the word line (WL), plate line (PL), and bit line (BL) waveforms. Also included in FIG. 5A is a corresponding hysteresis loop diagram illustrating the polarization states of ferroelectric capacitor 16. The timing diagram of FIG. 5A is labeled at various points in time labeled t1 through t5. These same timing labels are used on the corresponding hysteresis loop diagram to illustrate the behavior of ferroelectric memory cell 12 during the first modified up only sensing scheme.

At an initial time t1, the word and plate lines of ferroelectric memory cell 12 are all set to zero volts, and the bit line is precharged to five volts. At the initial time t1, memory cell 12 is in a logic one state, which is also illustrated on the corresponding hysteresis diagram. Point t1 is located on the lower left portion of the hysteresis curve, and, by convention, represents the logic one state of memory cell 12. At time t2, word line 20' is stepped from the initial logic zero, voltage to a bootstrapped logic one voltage. Only changing the voltage on word line 20 does not change the location of the operating point on the hysteresis diagram, which is also labeled t2. At time t3, the plate line is pulsed to a logic one voltage with a positive-going pulse, and a voltage is developed on bit line 22'. Note that the incremental bit line voltage forces the voltage on bit line 22' to be greater than the nominal operating voltage of five volts. The operating point on the hysteresis diagram moves from t1, t2, to t3 (representing a positive applied voltage and a corresponding incremental positive voltage on bit line 22'). Between times t3 and t4, the sense amplifier signal is energized and the voltage on bit line 22 is resolved into a full logic one voltage, when compared to an appropriately selected reference voltage VR. At time t4, therefore, the voltages on word line 20', plate line 18, and bit line 22' are all high. This operating condition corresponds to zero volts being applied across ferroelectric capacitor 16, which is also illustrated and labeled t4 on the hysteresis diagram. At time t5 the original data state is restored, and linear or DRAM charge remains in the cell. Over time, however, the DRAM charge leaks away and the voltage at internal node 15 decays, which the operating point to t4 on the hysteresis loop diagram, which is also the initial operating point t1 in the embodiment of FIG. 5C.

FIG. 5B includes a timing diagram of ferroelectric memory cell 12 having a logic zero data state and a zero volt initial condition on internal node 15, again in the modified up only sensing mode. The timing diagram of FIG. 5B also includes word line (WL), plate line (PL), and bit line (BL) waveforms. The timing diagram of FIG. 5B includes points in time labeled t1 through t7 that are also used on the corresponding hysteresis loop diagram to illustrate the behavior of ferroelectric memory cell 12 during the modified up only sensing scheme.

At an initial time t1, the word and plate lines of ferroelectric memory cell 12 are again set to zero volts, with the bit line being precharged to five volts. At the initial time t1, memory cell 12 is in a logic zero state, which is also illustrated on the corresponding hysteresis diagram. By convention, point t1 is located on the positive Q axis to represent the logic zero state of memory cell 12. At time t2, word line 20 is stepped from the initial logic zero voltage to a logic one voltage. Changing the voltage on word line 20 in this case does change the location of the operating point on the hysteresis diagram, which is labeled t2, since the voltage on bit line 22' is decreased. At time t3, the plate line is pulsed to a logic one voltage with a positive-going pulse, and an additional voltage is developed on bit line 22'. The operating point on the hysteresis diagram moves from t1 to t2 to t3 (again, representing the changes in the word, plate, and bit line voltages). Between times t3 and t4, the sense amplifier signal is energized and the voltage on bit line 22 is resolved into a full logic zero voltage, when compared to an appropriately selected reference voltage VR. At time t4, therefore, the voltage on word line 20 and plate line 18 is high, and the voltage on bit line 22' is low. This operating condition corresponds to a full logic voltage being applied across ferroelectric capacitor 16, which is also illustrated and labeled t4 on the hysteresis diagram. At time t5, the plate line is returned to a logic zero level and the original operating point is restored.

FIG. 5C includes a timing diagram of ferroelectric memory cell 12 having a logic one data state and a zero volt initial condition on internal node 15. The timing diagram of FIG. 5C includes the word line (WL), plate line (PL), and bit line (BL) waveforms. Also included in FIG. 5C is a corresponding hysteresis loop diagram illustrating the polarization states of ferroelectric capacitor 16. The timing diagram of FIG. 5C is labeled at various points in time labeled t1 through t5. These same timing labels are used on the corresponding hysteresis loop diagram to illustrate the behavior of ferroelectric memory cell 12 during the first modified up only sensing scheme.

At an initial time t1, the word and plate lines of ferroelectric memory cell 12 are all set to zero volts, and the bit line is precharged to five volts. At the initial time t1, memory cell 12 is in a logic one state, which is also illustrated on the corresponding hysteresis diagram. By convention, point t1 is located on the negative "Q" axis to represent the logic one state of memory cell 12. At time t2, word line 20' is stepped from the initial logic zero voltage to a bootstrapped logic one voltage. Changing the voltage on word line 20' in this case also changes the location of the operating point on the hysteresis diagram, which is also labeled t2 (due to the slight decrease in bit line voltage). At time t3, the plate line is pulsed to a logic one voltage with a positive-going pulse, and the original bit line voltage and operating point are restored. Between times t3 and t4, the sense amplifier signal is energized and the voltage on bit line 22 is resolved into a full logic one voltage, when compared to an appropriately selected reference voltage VR. At time t4, therefore, the voltages on word line 20', plate line 18, and bit line 22' are all high. This operating condition corresponds to zero volts being applied across ferroelectric capacitor 16, which is also illustrated and labeled t4 on the hysteresis diagram. At time t5 the original data state is restored, and linear or DRAM charge remains in the cell. Over time, however, the DRAM charge leaks away and the voltage at internal node 15 decays, and the initial operating point t1 on the hysteresis loop is restored.

Figure 6A:
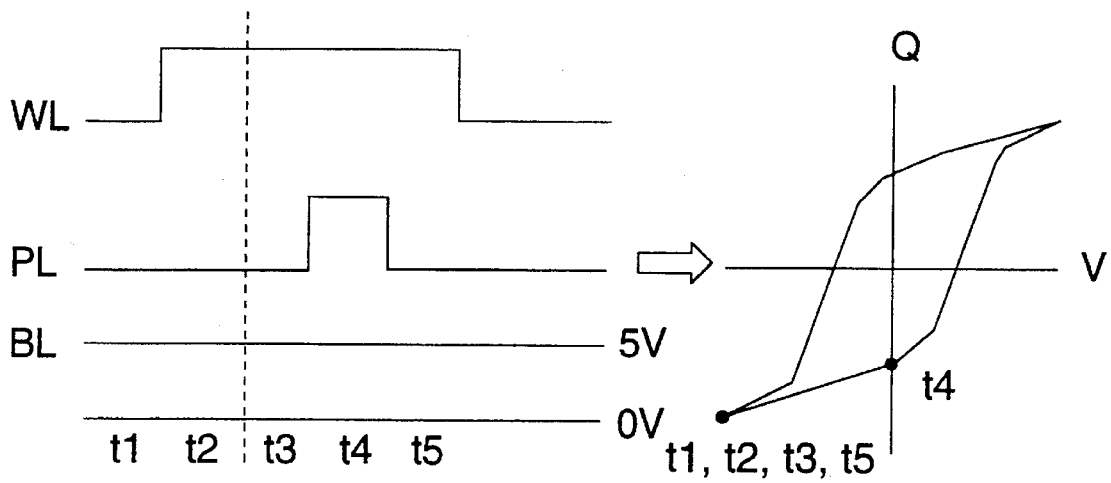
FIGS. 6A–6C are combined timing/hysteresis diagrams that illustrate the operation of a second "modified up only" ferroelectric memory sensing method according to the present invention.
Figure 6B:
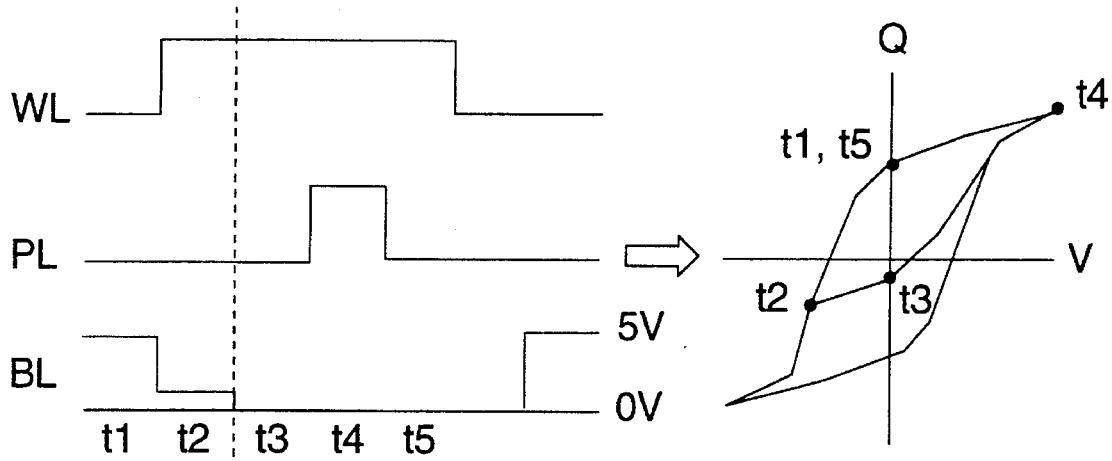
Figure 6C:
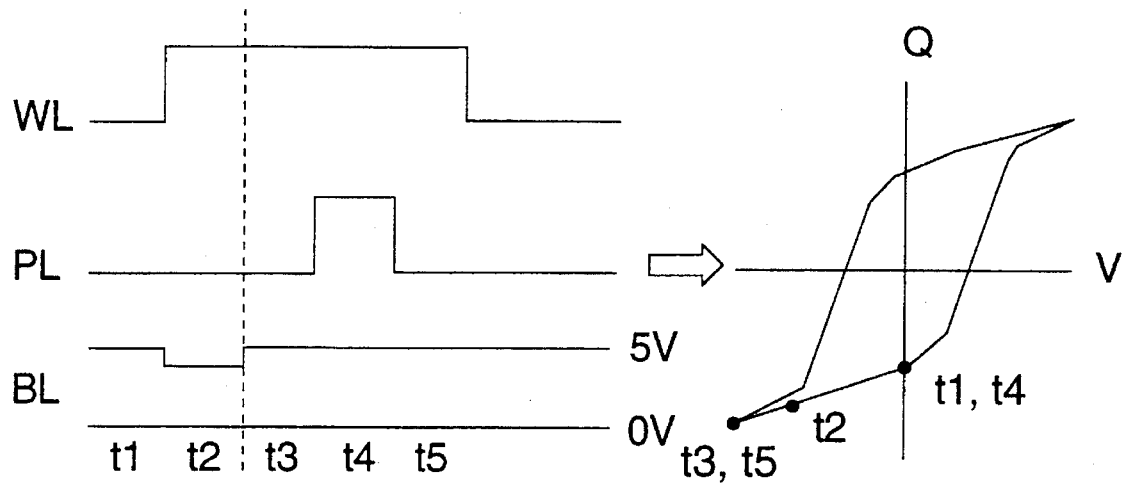

Referring now to FIGS. 6A–C, a second alternative "modified up only" (MUP) sensing scheme is illustrated in three combined timing/hysteresis diagrams. FIG. 6A includes a timing diagram of ferroelectric memory cell 12 having a logic one data state and a five volt initial condition on internal node 15. The timing diagram of FIG. 6A includes the word line (WL), plate line (PL), and bit line (BL) waveform. Also included in FIG. 6A is a corresponding hysteresis loop diagram illustrating the polarization states of ferroelectric capacitor 16. The timing diagram of FIG. 6A is labeled at various points in time labeled t1 through t5. These same timing labels are used on the corresponding hysteresis loop diagram to illustrate the behavior of ferroelectric memory cell 12 during the second modified up only sensing scheme.

At an initial time t1, the word and plate lines of ferroelectric memory cell 12 are all set to zero volts, and the bit line is precharged to five volts. At the initial time t1, memory cell 12 is in a logic one state, which is also illustrated on the corresponding hysteresis diagram. By convention, point t1 is located on the negative "Q" axis to represent the logic one state of memory cell 12. At time t2, word line 20' is stepped from the initial logic zero voltage to a bootstrapped logic one voltage. Only changing the voltage on word line 20 does not change the location of the operating point on the hysteresis diagram, which is also labeled t2. Between times t2 and t3, the sense amplifier signal is energized and the voltage on bit line 22 is resolved into a full logic one voltage, when compared to an appropriately selected reference voltage VR. At time t3, therefore, the voltages on word line 20' and bit line 22' are high, whereas the voltage on plate line 18 is low. This operating condition corresponds to a full logic level being applied across ferroelectric capacitor 16, which is also illustrated and labeled t3 on the hysteresis diagram (which is also the initial operating point). At time t4, the plate line is pulsed high if desired, resulting in no voltage across ferroelectric capacitor 16. At time t5, the plate line is restored to a logic zero voltage and the original operating point at t1 on the hysteresis loop diagram is restored.

FIG. 6B includes a timing diagram of ferroelectric memory cell 12 having a logic zero data state and a zero volt initial condition on internal node 15, again in the second modified up only sensing mode. The timing diagram of FIG. 6B also includes word line (WL), plate line (PL), and bit line (BL) waveforms. The timing diagram of FIG. 5B includes points in time labeled t1 through t5 that are also used on the corresponding hysteresis loop diagram to illustrate the behavior of ferroelectric memory cell 12 during the modified up only sensing scheme.

At an initial time t1, the word and plate lines of ferroelectric memory cell 12 are again set to zero volts, with the bit line being precharged to five volts. At the initial time t1, memory cell 12 is in a logic zero state, which is also illustrated on the corresponding hysteresis diagram. By convention, point t1 is located on the positive Q axis to represent the logic zero state of memory cell 12. At time t2, word line 20 is stepped from the initial logic zero voltage to a logic one voltage. Changing the voltage on word line 20 in this case does change the location of the operating point on the hysteresis diagram, which is labeled t2, since the voltage on bit line 22' is decreased. Between times t2 and t3, the sense amplifier signal is energized and the voltage on bit line 22 is resolved into a full logic zero voltage, when compared to an appropriately selected reference voltage VR. At time t4, the plate line is pulsed high if desired, resulting in a full logic voltage across ferroelectric capacitor 16. At time t5, the plate line is restored to a logic zero voltage and the original operating point at t1 on the hysteresis loop diagram is restored. At some time subsequent to t5, the bit line voltage is again precharged to five volts.

FIG. 6C includes a timing diagram of ferroelectric memory cell 12 having a logic one data state and a zero volt initial condition on internal node 15. The timing diagram of FIG. 6C includes the word line (WL), plate line (PL), and bit line (BL) waveforms. Also included in FIG. 6C is a corresponding hysteresis loop diagram illustrating; the polarization states of ferroelectric capacitor 16. The timing diagram of FIG. 6C is labeled at various points in time labeled t1 through t5. These same timing labels are used on the corresponding hysteresis loop diagram to illustrate the behavior of ferroelectric memory cell 12 during the first modified up only sensing scheme.

At an initial time t1, the word and plate lines of ferroelectric memory cell 12 are all set to zero volts, and the bit line is precharged to five volts. At the initial time t1, memory cell 12 is in a logic one state, which is also illustrated on the corresponding hysteresis diagram. By convention, point t1 is located on the negative "Q" axis to represent the logic one state of memory cell 12. At time t2, word line 20' is stepped from the initial logic zero voltage to a bootstrapped logic one voltage. Changing the voltage on word line 20' in this case also changes the location of the operating point on the hysteresis diagram, which is also labeled t2 (due to the slight decrease in bit line voltage). Between times t2 and t3, the sense amplifier signal is energized and the voltage on bit line 22 is resolved into a full logic one voltage, when compared to an appropriately selected reference voltage VR. At time t3, therefore, the voltages on word line 20' and bit line 22' are high, and the voltage on plate line 18 is low. This operating condition corresponds to a full logic voltage being applied across ferroelectric capacitor 16, which is also illustrated and labeled t3 on the hysteresis diagram. At time t4, the plate line is pulsed high if desired, resulting in zero volts across ferroelectric capacitor 16. At time t5, the plate line is restored to a logic zero voltage and the full logic voltage is applied across ferroelectric capacitor 16. At time t5 the original data state is restored, and linear or DRAM charge remains in the cell. Over time, however, the DRAM charge leaks away and the voltage at internal node 15 decays, and the initial operating point t1 on the hysteresis loop is restored.

Figure 7:
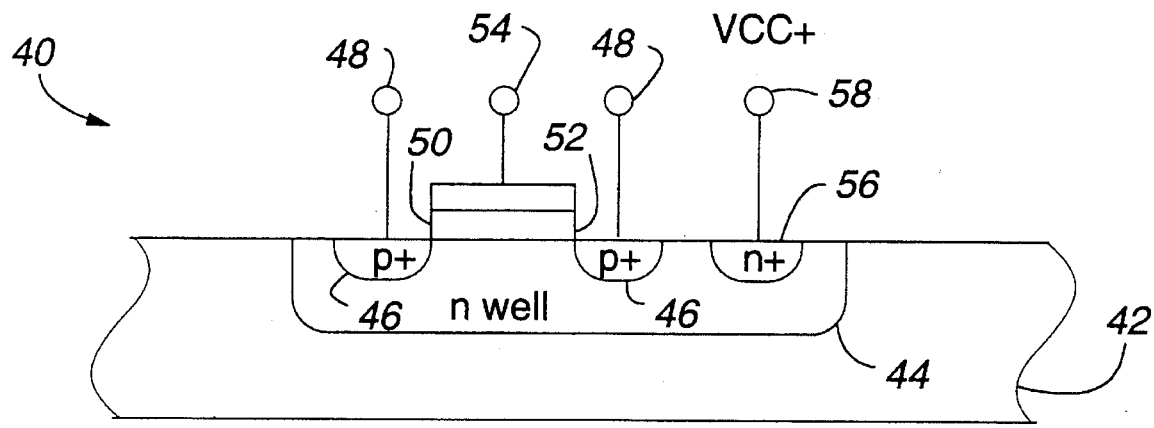
FIG. 7 is a cross-sectional diagram of a portion of an integrated circuit memory illustrating a biasing condition for optimum performance with the sensing methods of the present invention.

It should be noted that the method of the present invention can cause the bit lines to become more positive than the power supply voltage. See in particular FIG. 5A at time t3. Such a voltage excursion can create problems by forward biasing transistor junctions and injecting current into the substrate of an integrated circuit memory. To avoid this possibility, two solutions are proposed. In FIG. 7, a portion 40 of an integrated circuit memory is shown having a silicon substrate 42, an N-well 44; and an N+ contact 56 with corresponding node 58. A P-channel transistor is formed in N-well 44 including P+ source/drain diffusions 46 and corresponding nodes 48. A gate oxide 50, gate electrode 52, and corresponding node 54 complete the P-channel transistor. Node 58 in FIG. 7 is biased to a VCC+ voltage that is more positive than the most positive excursion of bit line 22'. For example, if the most positive bit line excursion is 5.5 volts, the voltage on node 58 would have to be at least 5.5 volts. In this way, it can be assured that no junction inside the integrated circuit will undesirably forward bias, and current will not be injected into the substrate. Conventional sense amplifiers including P-channel load/pullup circuitry can be used.

Figure 8:
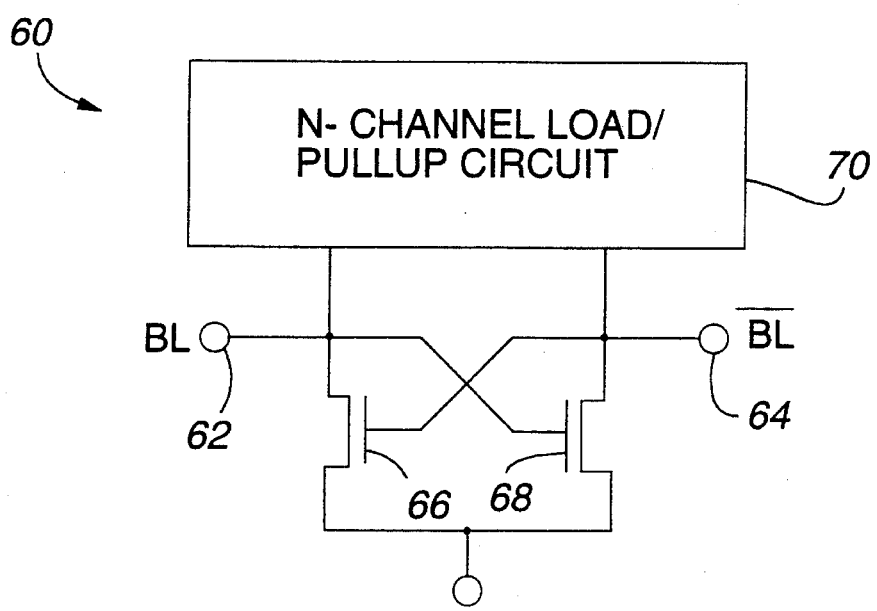
FIG. 8 is a schematic diagram of an N-channel only sense amplifier that can be used for optimum performance with the sensing methods of the present invention.

An alternative proposed solution is shown in FIG. 8. A sense amplifier 60 includes two N-channel transistors 66 and 68 cross-coupled to form a latch, which is in turn coupled to complementary bit lines 62 and 64. An N-channel load/pullup circuit 70 includes only N-channel transistors, so that the problem of forward biased junctions and substrate current injection is avoided.

Having described and illustrated the principles of the invention in a preferred embodiment thereof, it is appreciated by those having skill in the art that the invention can be modified in arrangement and detail without departing from such principles. For example, the method described above works equally well with a one-transistor, one capacitor ferroelectric memory cell and single bit line, or a two-transistor, two capacitor ferroelectric memory cell having a differential bit line. We therefore claim all modifications and variation coming within the spirit and scope of the following claims.

We claim:

1. In a ferroelectric memory cell having a plate line, a word line, and a bit line, the bit line being coupled to a sense amplifier, a sensing method comprising the steps of:

biasing all N-wells in the sense amplifier to a voltage greater than the most positive voltage excursion of the bit line;

precharging the bit line to a logic one voltage;

setting the word and plate lines to an initial logic zero voltage;

stepping the word line from the initial logic zero voltage to the logic one voltage;

stepping the plate line from the initial logic zero voltage to the logic one voltage;

activating the sense amplifier to resolve voltage developed on the bit line to a full logic voltage while the word and plate lines are at the logic one voltage; and returning the word and plate lines to the initial logic zero voltage.

2. The method of claim 1 in which the step of stepping the word line voltage from the initial logic zero voltage to the logic one voltage comprises the step of stepping the word line voltage from the initial logic zero voltage to a bootstrapped logic one voltage greater than the logic one voltage.

3. The method of claim 1 further comprising the step of coupling the bit line to a sense amplifier comprised solely of N-channel transistors.

4. In a ferroelectric memory cell having a plate line, a word line, and a bit line, the bit line being coupled to a sense amplifier, a sensing method comprising the steps of:

biasing all N-wells in the sense amplifier to a voltage greater than the most positive voltage excursion of the bit line;

precharging the bit line to a logic one voltage;

setting the word and plate lines to an initial logic zero voltage;

stepping the word line from the initial logic zero voltage to the logic one voltage;

activating the sense amplifier to resolve voltage developed on the bit line to a full logic voltage while the word line is at the logic one voltage and the plate line is at the logic zero voltage;

pulsing the plate line with a positive-going pulse; and returning the word line to the initial logic zero voltage.

5. The method of claim 4 in which the step of stepping the word line voltage from the initial logic zero voltage to the logic one voltage comprises the step of stepping the word line voltage from the initial logic zero voltage to a bootstrapped logic one voltage greater than the logic one voltage.

6. The method of claim 4 further comprising the step of coupling the bit line to a sense amplifier comprised solely of N-channel transistors.

7. In a ferroelectric memory cell having a plate line, a word line, and a bit line, the bit line being coupled to a sense amplifier, a sensing method comprising the steps of:

precharging the bit line to a power supply voltage, the power supply voltage representing a logic one voltage;

setting the word and plate lines to an initial logic zero voltage;

stepping the word line from the initial logic zero voltage to the logic one voltage;

stepping the plate line from the initial logic zero voltage to the logic one voltage;

activating the sense amplifier to resolve voltage developed on the bit line to a full logic voltage while the word and plate lines are at the logic one voltage; and returning the word and plate lines to the initial logic zero voltage.

8. The method of claim 7 in which the precharging step comprises the step of precharging the bit line to a power supply voltage of five volts.

9. The method of claim 7 in which the precharging step comprises the step of precharging the bit line to a power supply voltage of 3.3 volts.

10. The method of claim 7 in which the step of stepping the word line voltage from the initial logic zero voltage to the logic one voltage comprises the step of stepping the word line voltage from the initial logic zero voltage to a bootstrapped logic one voltage greater than the logic one voltage.

11. The method of claim 7 further comprising the step of biasing all N-wells in the sense amplifier to a voltage greater than the most positive voltage excursion of the bit line.

12. The method of claim 7 further comprising the step of coupling the bit line to a sense amplifier comprised solely of N-channel transistors.

* * * * *